US010847467B2

(12) United States Patent
Collins et al.

(10) Patent No.: US 10,847,467 B2
(45) Date of Patent: Nov. 24, 2020

(54) POWER-DELIVERY METHODS FOR EMBEDDED MULTI-DIE INTERCONNECT BRIDGES AND METHODS OF ASSEMBLING SAME

(71) Applicant: Intel Corporation, Santa Clara, CA (US)

(72) Inventors: Andrew Collins, Chandler, AZ (US); Debendra Mallik, Chandler, AZ (US); Mathew J. Manusharow, Phoenix, AZ (US); Jianyong Xie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/658,866

(22) Filed: Oct. 21, 2019

(65) Prior Publication Data
US 2020/0051916 A1 Feb. 13, 2020

Related U.S. Application Data

(63) Continuation of application No. 15/937,411, filed on Mar. 27, 2018, now Pat. No. 10,490,503.

(51) Int. Cl.
H01L 23/538 (2006.01)
H01L 25/065 (2006.01)
H01L 25/18 (2006.01)
H01L 21/48 (2006.01)
H01L 23/00 (2006.01)

(52) U.S. Cl.
CPC ...... H01L 23/5381 (2013.01); H01L 21/4853 (2013.01); H01L 21/4857 (2013.01); H01L 23/5384 (2013.01); H01L 23/5385 (2013.01); H01L 23/5386 (2013.01); H01L 24/16 (2013.01); H01L 25/0655 (2013.01); H01L 25/18 (2013.01); H01L 2224/16235 (2013.01); (Continued)

(58) Field of Classification Search
CPC ............ H01L 23/5381; H01L 23/5385; H01L 25/0655; H01L 25/18; H01L 23/5386; H01L 21/4853; H01L 21/4857; H01L 23/5384; H01L 24/16; H01L 2224/16235; H01L 2924/1431; H01L 2924/1434; H01L 24/14; H01L 2224/14104; H01L 24/17; H01L 2224/1712; H01L 2924/00014; H01L 2924/15192; H01L 2224/16225; H01L 23/147; H01L 23/49838; H01L 23/538; H01L 23/50; H01L 2223/6677; H01L 23/66; H01L 23/5226
See application file for complete search history.

(56) References Cited

U.S. PATENT DOCUMENTS 9,666,559 B2  5/2017  Wang et al.
10,580,738 B2 * 3/2020 Sikka ............... H01L 24/14
(Continued)

OTHER PUBLICATIONS

International Search Report and Written Opinion for International Patent Application No. PCT/US2019/02002 dated Jun. 12, 2019, 12 pgs.

Primary Examiner — David Vu
(74) Attorney, Agent, or Firm — Schwabe, Williamson & Wyatt, P.C.

(57) ABSTRACT

An embedded multi-die interconnect bridge (EMIB) die is configured with power delivery to the center of the EMIB die and the power is distributed to two dice that are interconnected across the EMIB die.

20 Claims, 7 Drawing Sheets

(52) U.S. Cl.
CPC ............... *H01L 2924/1431* (2013.01); *H01L 2924/1434* (2013.01)

(56) References Cited

U.S. PATENT DOCUMENTS

| | | |
|---|---|---|
| 2010/0327424 A1 | 12/2010 | Braunisch et al. |
| 2013/0168854 A1 | 7/2013 | Karikalan et al. |
| 2014/0117552 A1 | 5/2014 | Qian et al. |
| 2016/0133571 A1 | 5/2016 | Lee et al. |
| 2017/0290158 A1 | 10/2017 | Pihlman et al. |

* cited by examiner

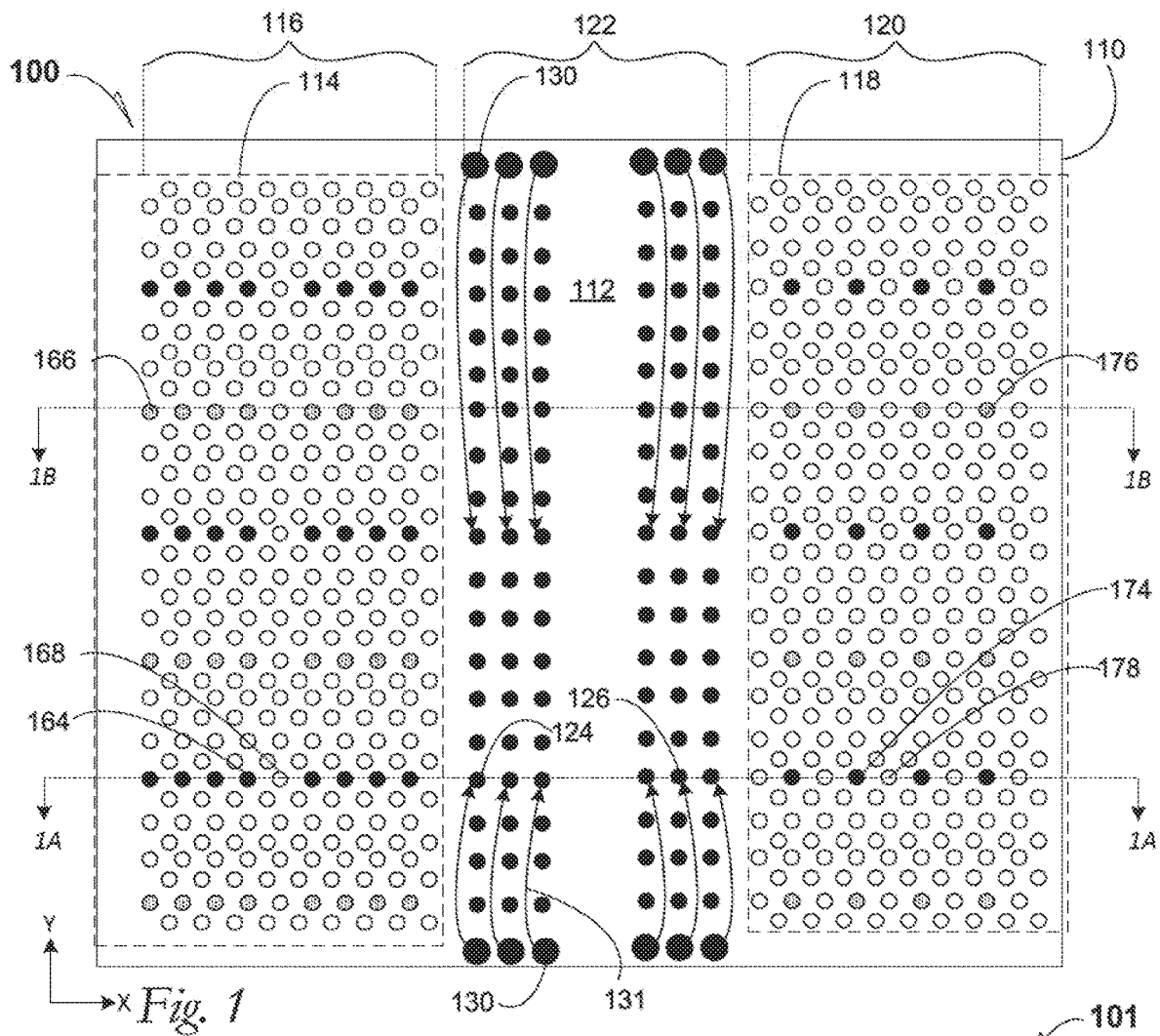
Fig. 1
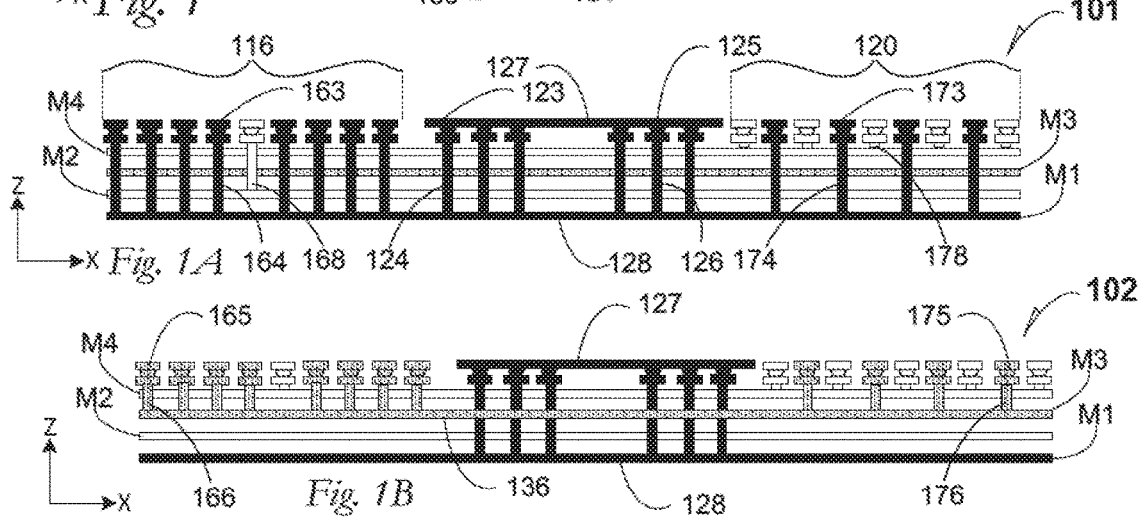
Fig. 1A
Fig. 1B

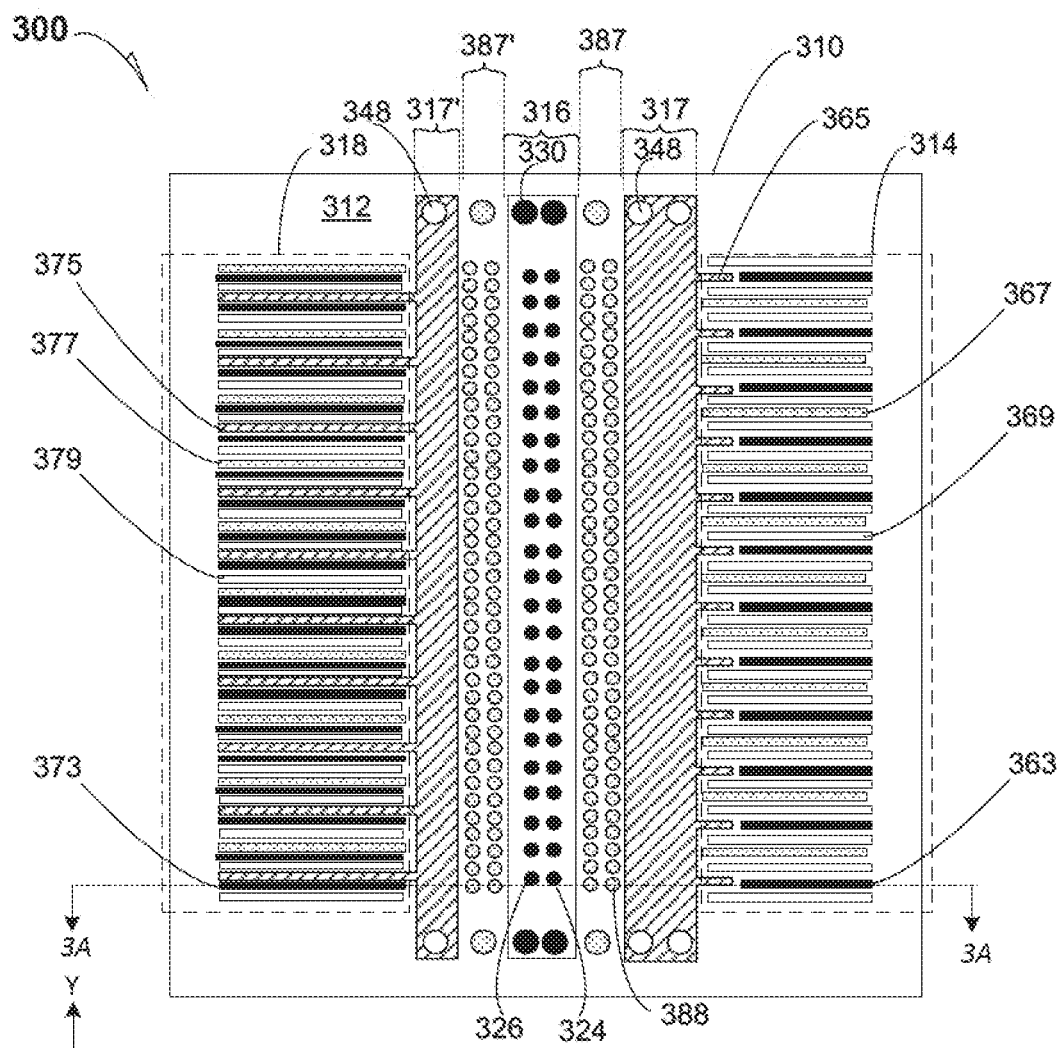
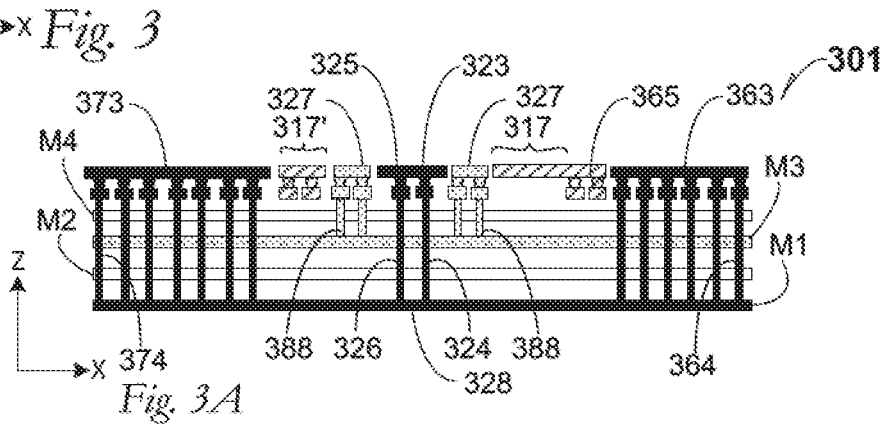
Fig. 3
Fig. 3A

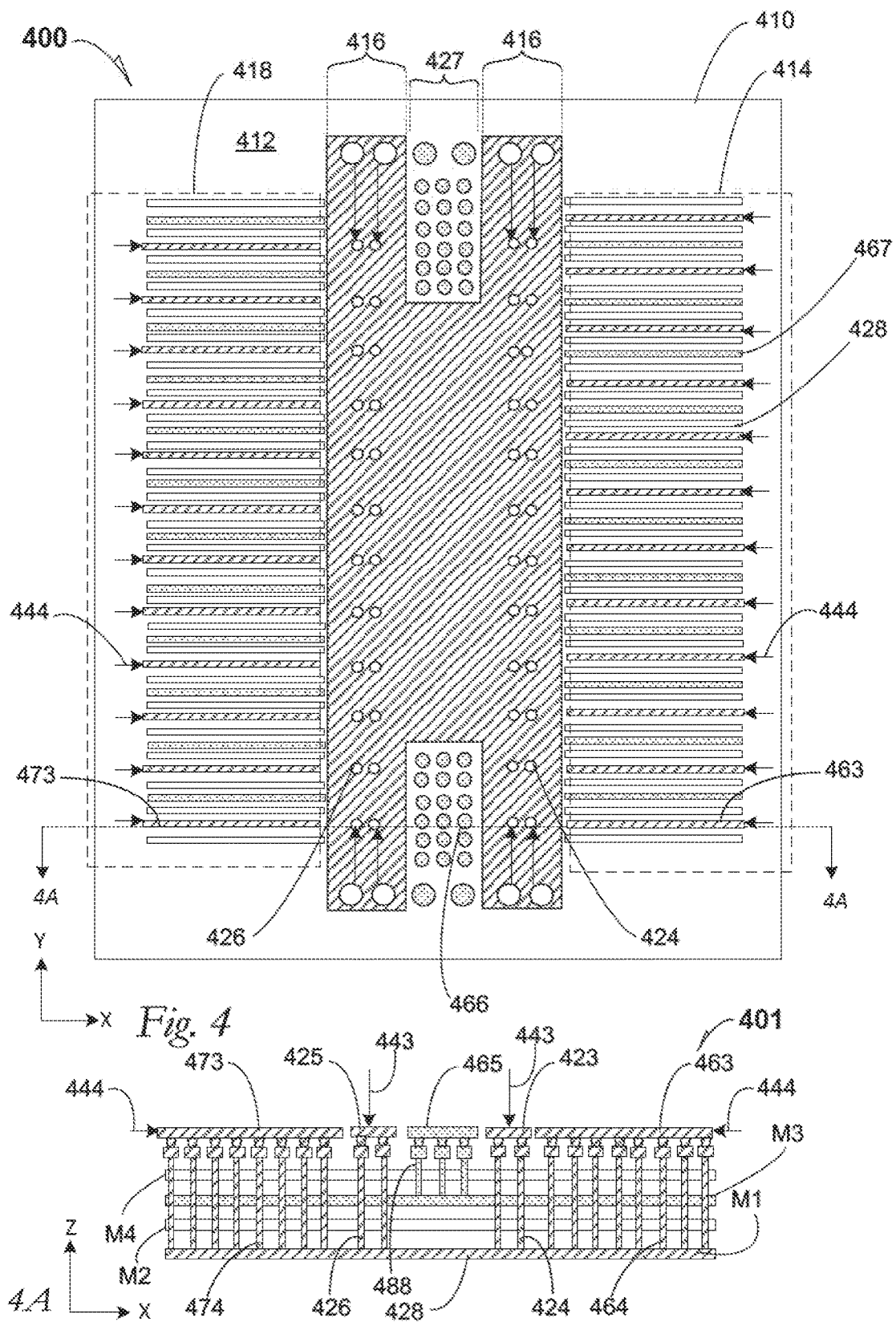

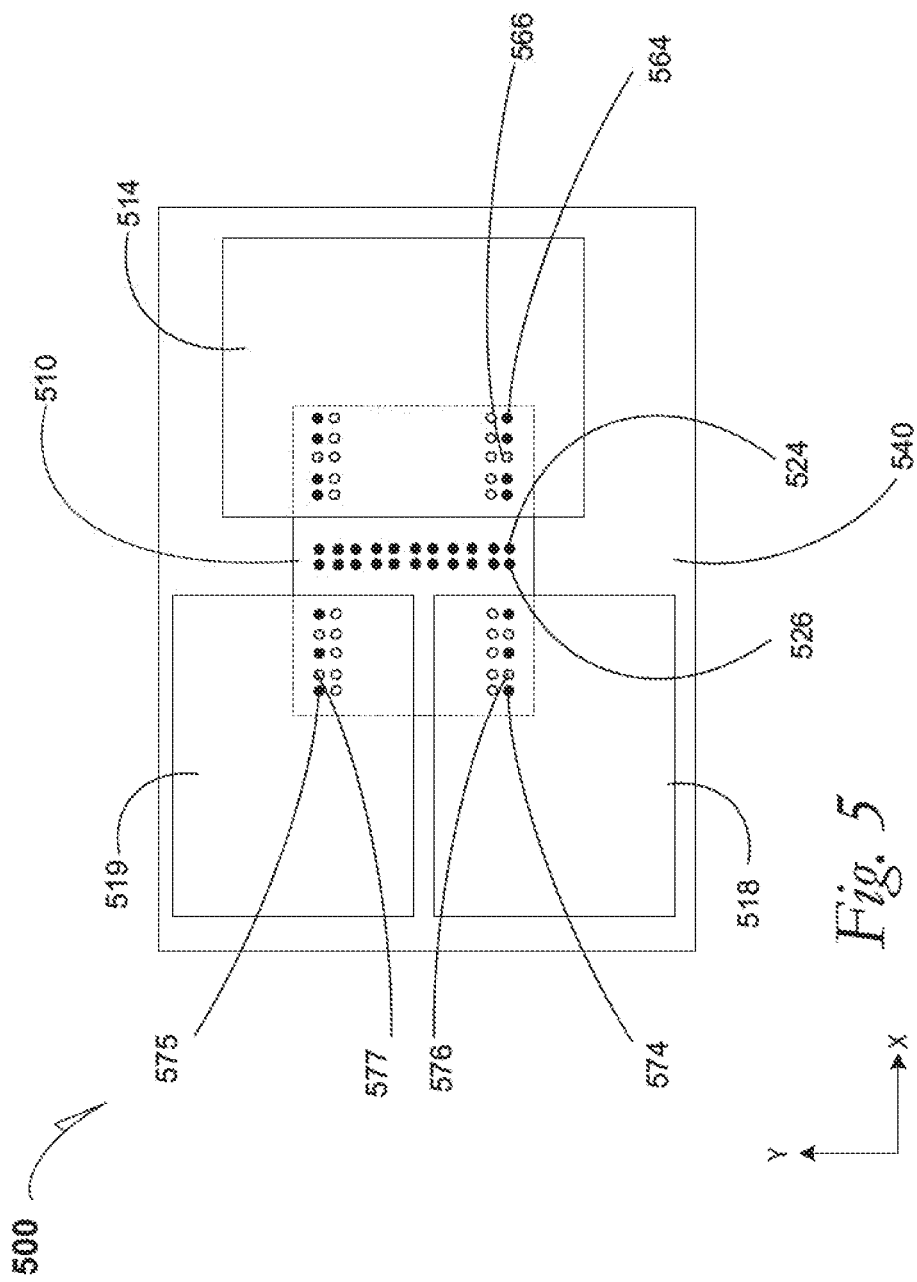

US 10,847,467 B2

POWER-DELIVERY METHODS FOR EMBEDDED MULTI-DIE INTERCONNECT BRIDGES AND METHODS OF ASSEMBLING SAME

CROSS-REFERENCE TO RELATED APPLICATIONS

This application is a continuation of U.S. patent application Ser. No. 15/937,411, filed on Mar. 27, 2018, the entire contents of which is hereby incorporated by reference herein.

FIELD

This disclosure relates to power delivery for embedded multi-die interconnect bridge architectures for semiconductor device packages.

BACKGROUND

Semiconductive device miniaturization during packaging includes challenges to allow high-speed and small volume interconnects between dice, and delivering power to the dice.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1 is a top plan of an embedded multi-die interconnect bridge die that exposes micro-via arrays for interconnection between two semiconductive devices according to an embodiment;

FIG. 1A is a cross-section partial cut away elevation and projection of metallization for the bridge die depicted in FIG. 1, taken along the section line 1A-1A according to an embodiment;

FIG. 1B is a cross-section partial cut away elevation and projection of metallization for the bridge die taken from FIG. 1 along the section line 1B-1B according to an embodiment;

FIG. 3 is a top plan of an interconnect bridge die 310 where multiple power domains are stitched into a bridge die to service a first die and a subsequent die according to an embodiment;

FIG. 3A is a cross-section partial cut away elevation and projection of metallization for the bridge die depicted in FIG. 3, taken along the section line 3A-3A according to an embodiment;

FIG. 4 is a top plan of an interconnect bridge die where an enhanced EMIB power delivery architecture with a single power domain is stitched into a bridge die according to an embodiment;

FIG. 4A is a cross-section partial cut away elevation and projection of metallization for the bridge die depicted in FIG. 4, taken along the section line 4A-4A according to an embodiment;

FIG. 5 is a top plan of an embedded multi-die interconnect bridge package according to an embodiment;

DETAILED DESCRIPTION

Figure 2:
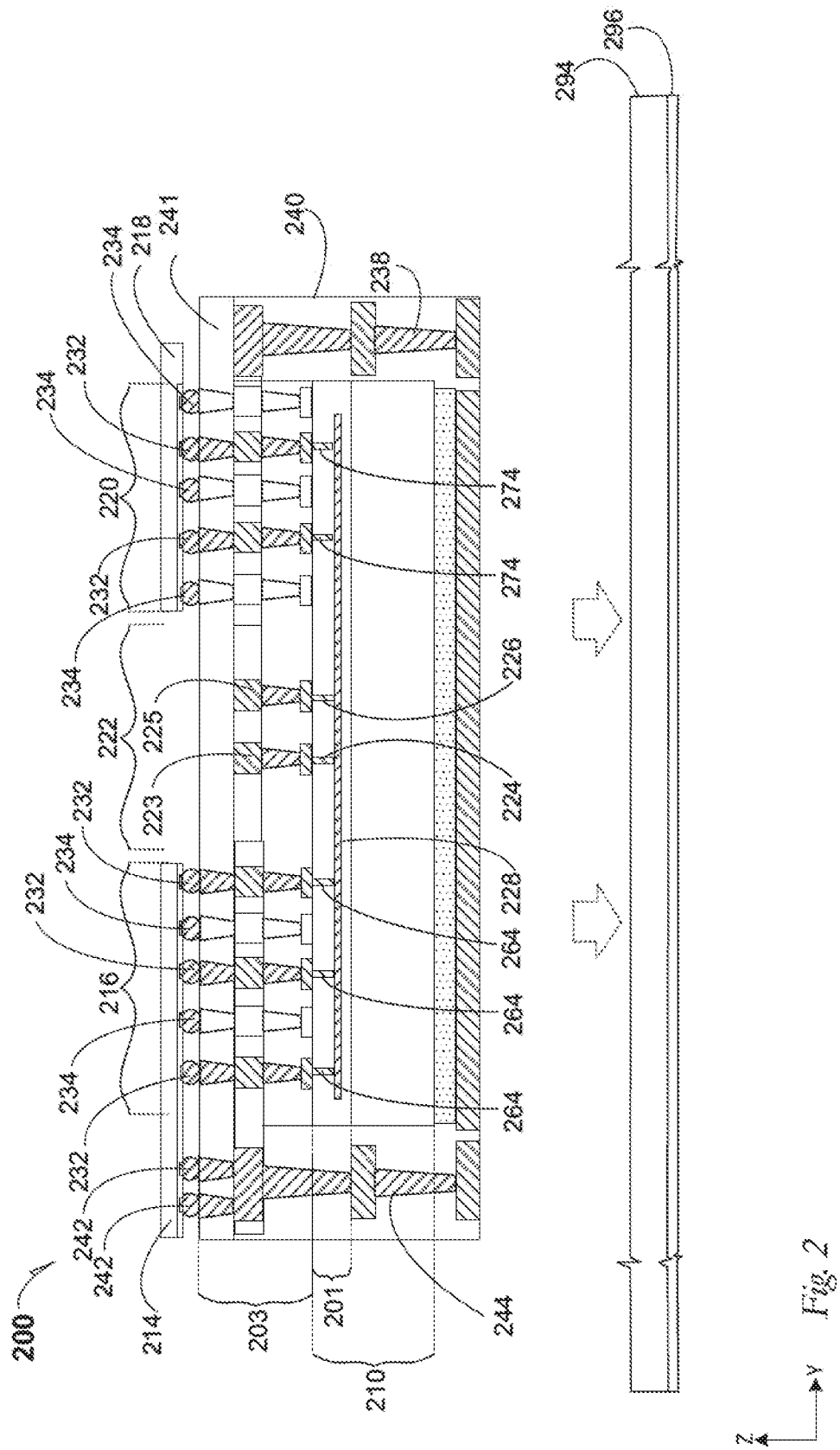
FIG. 2 is a cross-section cut-away and projection perspective elevation of an embedded multi-die interconnect bridge package according to an embodiment.

An embedded multi-die interconnect bridge (EMIB) architecture includes at least two semiconductive devices that are interconnected across an EMIB die. Power delivery to the interconnected semiconductive devices is accomplished by delivering power to a center region of the EMIB die, which may be referred to as a "flood plain." Power distribution to each of the interconnected semiconductive devices through the metallization on the EMIB die, can be through the flood plain and it can be supplemented by peripheral power introduction to the EMIB die.

Power and ground presence in the EMIB metallization is delivered to the flood plain, and current flow is selected within the several metallization layers, to usefully affect inductive-loop issues as well as electromagnetic noise issues, according to several embodiments. Supplemental power is added at the periphery of the EMIB die in addition to flood-plain power delivery at the EMIB die center, according to several embodiments.

In an embodiment, the bridge is partially embedded in a package. In an embodiment, the bridge is not embedded, but it has a configuration of bridging between two dice.

FIG. 1 is a top plan 100 of an embedded multi-die interconnect bridge (EMIB) die 110 that exposes micro-via arrays for interconnection between two semiconductive devices according to an embodiment. The EMIB die 110 or "bridge die" 110 includes an interconnect surface 112 onto which several micro-via arrays are configured. In an embodiment, a micro via is quantified as a via that is less than 1 millimeter in diameter. In an embodiment, a micro via is quantified in a range from 25 microns (micrometer) to 500 microns.

A portion of a first die footprint 114 (hereinafter, first die 114 or first die side 114) is projected with dashed lines onto the interconnect surface 112 of the bridge die 110, and a first micro-via array 116 is configured within the bridge die 110 at the interconnect surface 112 to intersect with the first die 114. A portion of a subsequent die footprint 118 (hereinafter, subsequent die 118 or subsequent die side 118) is depicted with dashed lines projected onto the interconnect surface 112 of the bridge die 110 and a subsequent micro-via array 120 is configured within the bridge die at the interconnect surface 112 to intersect with the subsequent die 118.

Electrical power connections on the interconnect surface 112 include power-delivery micro vias 124 and 126, and power-distribution micro-vias 164 and 174. Power-delivery micro-vias are illustrated solid dark, and they are located within a flood plain 122 portion of the bridge die 110. As illustrated, the flood plain 122 is located between the first micro-via array 116 and the subsequent micro-via array 120. Power-delivery micro-vias 124 and 126 are located between a power source (not illustrated) and a power rail 128 (see FIG. 1A). Power-distribution micro-vias 164 and 174 are located between the power rail 128 and the connections to the respective first and subsequent dice 114 and 118.

Electrical ground connections on the interconnect surface 112 include ground micro vias 166 and 176. Ground micro vias are illustrate shaded. Signal I/O electrical connections on the interconnect surface 112 include signal I/O vias 168 and 178. Signal I/O micro vias are illustrated unshaded throughout this disclosure.

The power flood plain is 122 is located on the interconnect surface 112 of the bridge die 110 between the respective first and subsequent dice 114 and 118. The power flood plain 122 is centrally located, meaning, that it is located between the footprint regions formed by the respective first and subsequent dice 114 and 118, although the power flood plain 122 may not be exactly geometrically located across the center region of the interconnect surface 112 of the bridge die 110. In an embodiment, the power flood plain 122 is located in the approximate bilateral center (Y-direction describing an approximate symmetry axis) of the bridge die 110, such that power to be delivered to the respective first and subsequent dice 114 and 118, is introduced to the bridge die 110 at the flood plain 122, and the current is peripherally delivered to the respective dice 114 and 118 through metallization of the bridge die 110 (see FIG. 1A). Power is introduced to the bridge die 110 at power bumps 130 near the periphery of the bridge die 110, and current is routed to power-delivery micro vias 124 and 126, the power rail 128, and the power-distribution miro vias 164 and 174.

In an embodiment, the first die 114 requires more power than the subsequent die 118. In this embodiment, the first die 114 may be referred to as a mother die 114 and the subsequent die 118 may be referred to as a daughter die 118. In an example embodiment, the first die 114 is a logic die such as a processor made by Intel Corporation of Santa Clara, Calif., and the subsequent die 118 is a memory die.

Attention is directed to a cross-section line 1A-1A. In an embodiment, six power-delivery micro vias 124 are located within the power flood plain 122, eight power-distribution micro vias 164 are located within the first micro-via array 116, and four power-distribution micro vias 174 are located within the subsequent micro-via array 120. Where more power is required at the mother die 114, and as seen along the section line 1A-1A, eight power-distribution micro vias 164 within the first micro-via array 116 service the mother die 114. Where less power is required at the daughter die 118, four power-distribution micro vias 174 within the subsequent micro-via array 120 service the daughter die 118.

FIG. 1A is a cross-section partial cut away elevation and projection of metallization 101 for the bridge die 110 depicted in FIG. 1, taken along the section line 1A-1A according to an embodiment. The metallization 101 is vertically (Z-direction) expanded in the illustration and includes in an embodiment, metal-1 (M1), M2, M3 and M4. The metallization lines including vertical (Z-direction) micro vias and horizontal (X-direction) traces, include non-shorting couplings among the several metallization structures, but the general structure of the metallizations is projected from the drawing. In other words, the several illustrated metallizations are projections and are not necessarily connected.

As illustrated, the power-delivery micro vias 124 and 126 depicted in FIG. 1 along the section line 1A-1A, can be vertically (Z-direction) mapped to selected power bond pads 123 and 125 within the metallization 101. The two reference-line enumerated power-delivery micro-via locations 124 and 126 depicted in FIG. 1, correspond to the respective two reference-line enumerated power bond pads 123 and 125, which are also illustrated solid dark. The reference-line enumerated power bond pads 123 and 125, however, are an integral part of a power header 127 that is not illustrated in FIG. 1.

Power routing through the metallization 101 originates at the power bumps 130 (FIG. 1) and current is routed (details not illustrated) through the power flood plain 122 to the illustrated power-delivery micro vias 124 and 126 through the power header 127, and to the power rail 128 at M1 within the metallization 101 according to an embodiment.

For the first die 114, current flows from the power header 127 within the flood plain 122 of the bridge die 110, to M1 (the power rail 128), and then is peripherally distributed to the first die 114 by a first power-distribution micro via 164. For the subsequent die 118, current flows from the power header 127 within the power flood plain 122 of the bridge die 110, to M1 (the power rail 128), and then is peripherally distributed to the subsequent die 118 by a subsequent power-distribution micro via 174. As illustrated, the power-distribution micro vias 164 and 174, emerge from the metallization 101 to couple to semiconductor-device structures 163 and 173. By viewing both FIG. 1 and FIG. 1A, it is seen that the power-distribution micro-vias 164 and 174, emerge at the respective die first side 114 and a die subsequent side 118 of the bridge die 110.

Enhanced EMIB power delivery is accomplished as illustrated, by using additional bridge pads and EMIB via connections into internal layers of the bridge die 110 metallization 101 at the flood plain 122, and more micro-via connections between electrical bump fields for the surface-mount first and subsequent dice 114 and 118. In the illustrated embodiment, 24 first-die power-distribution micro vias 164 are located within the first micro-via array 116, and 12 subsequent-die power-distribution micro-vias 174 are located within the subsequent micro-via array 120. For the first die power-distribution micro-vias 164, a bond pad 163 provides an interface surface to the first die 114, such as for an electrical bump. For the subsequent-die power-distribution micro-vias 174, a bond pad 173 provides an interface surface to the subsequent die 118, such as for an electrical bump.

As illustrated in this embodiment, two metallization levels, M2 and M4 of the metallization 101, are configured with input/output signal rails. The signal I/O micro-via 168 contacts the M2 signal I/O rail within the first die micro-via array 116. The signal I/O micro-via 178 contacts the M4 signal I/O rail within the subsequent die micro-via array 120.

FIG. 1B is a cross-section partial cut away elevation and projection of metallization 102 for the bridge die 110 taken from FIG. 1 along the section line 1B-1B according to an embodiment. Enhanced VSS return paths are depicted to provide more flexible EMIB power-delivery solutions. The metallization 102 is vertically (Z-direction) expanded in the illustration and includes in an embodiment, M1, M2, M3 and M4 illustrated in FIG. 1A. As illustrated, ground micro vias 166 and 176 are depicted along the section line 1B-1B in FIG. 1. The ground micro vias 166 and 176 can be mapped to respective ground bond pads 165 and 175 within the metallization 102, and the ground bond pads 165 and 175 are also illustrated shaded. The two reference-line enumerated ground micro vias 166 and 176 also depicted in FIG. 1, correspond to the two reference-line enumerated ground bond pads 165 and 175, which are also illustrated shaded. A total of eight ground bond pads 166 are intersected by the section line 1B-1B within the first die micro-via array 116. A total of four ground bond pads 176 are intersected by the section line 1B-1B within the subsequent die micro-via array 120. Current flow for ground connections includes a ground rail at M3, where VSS is collected.

In an embodiment, the power rail 128 and the ground rail 136 are spaced as far apart as possible, such as at M1 for the power rail 128 and at Mnth (in the drawing Mnth is M4) for the ground rail 136. In the illustrated embodiment, however the power rail 128 and the ground rail 136 are spaced apart only by a single metallization trace at M2. In an embodiment, where inductive current looping is desired to be minimized between power and ground rails, the power and ground rails are located adjacent each other, such as at M2 and M3. In an embodiment where current noise is desired to be minimized between power and ground rails, the power and ground rails are located spaced apart, such as at M1 and M4.

FIG. 2 is a cross-section cut-away and projection perspective elevation of an embedded multi-die interconnect bridge package 200 according to an embodiment. A bridge die 210 includes a metallization 201 such illustrated portions of the respective metallizations 101 and 102 depicted in FIGS. 1A and 1B. The EMIB package 200 includes a first semiconductive device 214 and a subsequent semiconductive device 218 that are coupled through the metallization 201 of the bridge die 210. Power is delivered to the bridge die 210 at a flood plain 222 that is between surface-mount die bump fields to allow enhanced power delivery to the semiconductive devices 214 and 218. The surface-mount die bump fields are approximately contained within respective first and subsequent die micro-via arrays 216 and 220.

In an embodiment, the metallization 201 is depicted in simplified form with a power rail 228 being one of the several layers of the metallization 201, and additional on-bridge power and ground pads are illustrated with EMIB power-delivery micro vias 224 and 226 (one occurrence each illustrated) between respective first and subsequent die micro-via arrays 216 and 220. Power is routed centrally to the bridge die 210 at power contacts 223 and 225 above the flood plain 222 of the bridge die 210, current is directed to the power-delivery micro-vias 224 and 226, to the power rail 228, and then to respective first and subsequent dice 214 and 218 through respective power-distribution micro-vias 264 and 274.

In an embodiment, the bridge die 210 is coupled to the first semiconductive device 214 through the first micro-via array 216. Within the first micro-via array 216 are included power-distribution micro vias 264, each of which is coupled to the first semiconductive device 214 through power electrical bumps 232 (three exemplary occurrences). Additionally in the cross section illustrated, I/O electrical bumps 234 (two exemplary occurrences) also couple the first semiconductive device 214 to the bridge die 210.

In an embodiment, the bridge die 210 is coupled to the subsequent semiconductive device 218 through the subsequent micro-via array 220. Within the subsequent micro-via array 220 are included power-distribution micro vias 274, each of which is coupled to the subsequent semiconductive device 218 through power electrical bumps 232 (two exemplary occurrences). Additionally in the cross section illustrated, I/O electrical bumps 234 (three exemplary occurrences) also couple the subsequent semiconductive device 218 to the bridge die 210.

In an embodiment, a packaging material 240 includes several build-up layers that are configured between the respective power-delivery and power-distribution micro vias 224 and 226, and 264 and 274, and the electrical bumps 232. Part of the packaging material 240 includes a top dielectric layer 241 that may be formed by planarizing a material after filling a laser-drilled via recess.

From the power contacts 223 and 225, power is routed to the respective first and subsequent semiconductive devices 214 and 218, by centrally introducing power to the bridge die 210 and peripherally delivering to the respective semiconductive devices 214 and 218 through the metallization 201 of the bridge die 210.

In an embodiment, power is routed to the power flood plain 222 above the bridge die 210 through a power-delivery via 238 within the packaging materials 240, and the power is routed (not illustrated) to the power contacts 223 and 225. Current flows from the power contacts 223 and 225, through power-delivery micro-vias 224 and 226.

For power delivery to the first semiconductive device 214, power originates for the bridge die 210 within the flood plain 222 at the power contact 223. Current is directed from the power contact 223 through the power-delivery micro via 224 toward the power rail 228, through the first die power-distribution micro vias 264 and to the power electrical bumps 232 that abut the first semiconductive device 214.

For power delivery to the subsequent semiconductive device 218, power originates for the bridge die 210 within the flood plain 222 at the power contact 225. Current is directed from the power contact 225 through the power-delivery micro via 226 toward the power rail 228, through the subsequent die power-distribution micro vias 274 and to the power electrical bumps 232 that abut the subsequent semiconductive device 218.

In an embodiment, supplemental power is directionally delivered to the first semiconductive device 214 such as through a power-delivery via 244 within package materials 240 of the EMIB package 200, to supplemental power bumps 242 that are at the periphery of the first die 214. Where the first die 214 requires more power than the subsequent die 218, the first die 214 may be referred to as a mother die 214 and the subsequent die 218 may be referred to as a daughter die 218.

In an embodiment, the EMIB package 200 is useful for a handheld computing system and the computing system includes a board 294 such as a motherboard 294. In an embodiment, the board 294 includes a shell 296 that provides both physical and dielectric protection to the combination of the first die 214, the bridge die 210 and the subsequent die 218.

FIG. 3 is a top plan 300 of an interconnect bridge die 310 where multiple power domains are stitched into the die 310 to service a first die 314 and a subsequent die 318 according to an embodiment. The bridge die 310 includes an interconnect surface 312 onto which several micro-via arrays and connection traces are configured. The bridge die 310 exposes micro-via arrays and connection traces for multiple power domains for interconnection between the two semiconductive devices 314 and 318 according to an embodiment.

The bridge die 310 uses an enhanced EMIB power-delivery configuration with multiple power domains stitched into the metallization 301 (see FIG. 3A). The interconnect surface 312 includes a first power-source flood plain 316 for a first power source VCC1, second power source flood plains 317 and 317' for a second power source VCC2, and a ground or common VSS flood plains 387 and 387'.

The first power-source VCC1 flood plain 316 includes all solid black contacts 330 and micro-vias 324 and 326 illustrated from the top plan 300. The second power source VCC2 flood plains 317 and 317' include cross-hatched sections and subsequent power-source contact pads 348.

A portion of a first die footprint 314 is projected with dashed lines onto the interconnect surface 312 of the bridge die 310, and a first power-source trace array 363 (one exemplary trace enumerated) is located on the interconnect surface 312 within the first die footprint 314. A portion of a subsequent die footprint 318 is also projected with dashed lines onto the interconnect surface 312 of the bridge die 310, and a first power-source trace array 373 (one exemplary trace enumerated) is located on the interconnect surface 312 within the subsequent die footprint 318.

The second power-source VCC2 flood plains 317 and 317' include all cross-hatched sections illustrated from the top plan 300. The second power-source is located at the top surface of metallization 301 (see FIG. 3A), and the first power source including the power-delivery micro-vias 324 and 236, are centrally introduced, penetrate into the metallization 310, and power is peripherally distributed to the respective first and subsequent semiconductive devices 314 and 318.

A second power-source trace array 365 (one exemplary trace enumerated) is located on the interconnect surface 312 within the first die footprint 314. A portion of the second power-source trace array 375 (one exemplary trace enumerated) is located on the interconnect surface 312 within the subsequent die footprint 318.

The ground VSS flood plains 387 and 387' including circular electrical bumps and micro-vias 388 that are depicted with shaded cross sections. A ground-source trace array 367 (one exemplary trace enumerated) is located on the interconnect surface 312 within the first die footprint 314. A portion of a ground-source trace array 377 (one exemplary trace enumerated) is located on the interconnect surface 312 within the subsequent die footprint 318.

Input/Output (I/O) traces are also located on the interconnect surface 312 of the bridge die 310. An I/O trace array 369 (one exemplary trace enumerated) is located on the interconnect surface 312 within the first die footprint 314. An I/O trace array 379 (one exemplary trace enumerated) is located on the interconnect surface 312 within the subsequent die footprint 318.

As illustrated, power source flood plains 316, 317 and 317' as well as ground source flood plains 387 and 387' are located centrally on the interconnect surface 312 of the bridge die 310, while I/O trace arrays 369 and 379 are located only within the respective die footprints 314 and 318.

Power delivery in this embodiment is to the center of the bridge die 310, and the two semiconductive devices, which may be referred to as mother 314 and daughter 318 dice, respectively, each may receive multiple power sources.

FIG. 3A is a cross-section partial cut away elevation and projection of metallization 301 for the bridge die 310 depicted in FIG. 3, taken along the section line 3A-3A according to an embodiment. The metallization 301 is vertically (Z-direction) expanded in the illustration and includes in an embodiment, metal-1 (M1), M2, M3 and M4.

The projections of metallization lines including vertical (Z-direction) micro vias and horizontal (X-direction) traces, include non-shorting couplings among the several metallization structures, but the general structure of the metallization 301 is projected from the drawing. In other words, the several illustrated metallizations are projections and are not necessarily connected.

In the illustrated power-delivery scheme, VCC1 related to power-delivery micro vias 324 and 326, and VSS, related to ground micro vias 388, are fed from the interconnect surface 312 depicted in FIG. 3, downwardly into the metallization 301, and then laterally and vertically to the respective first and subsequent dice 314 and 318. For VCC2 from the second power flood plains 317 and 317', extra die bumps are used on the first and subsequent dice 314 and 318, and power delivery remains above the level of M4.

As illustrated, the power-delivery micro vias 324 and 326 depicted in FIG. 3 along the section line 3A-3A and within the first power micro-via flood plain 316, can be vertically (Z-direction) mapped to selected power bond pads 323 and 325 within the metallization 301. Additionally, the reference-line enumerated micro-traces 363 and 373 depicted in FIG. 3, correspond to two reference-line enumerated power-distribution micro-vias 364 and 374, which are also illustrated solid dark. Current flow for the power traces 363 and 373 originates at the flood plain 316, flows downwardly (negative-Z direction) in the power-delivery micro vias 324 and 326, laterally through the power rail 328 at M1, vertically through respective power-distribution micro vias 364 and 374, to the respective power traces 363 and 373 and then to the respective mother and daughter dice 314 and 318.

A second power source is delivered as illustrated to include the subsequent power flood plains 317 and 317' as seen in FIG. 3, is depicted within FIG. 3A, but the cross-section 3A-3A intersects one second power-source trace array 365 that is located on the interconnect surface 312 within the first die footprint 314. A portion of the second VCC2 power source is delivered above the Mnth metallization level at power traces 365 and 375 from headers within the respective second power flood plains 317 and 317', which also do not cut through any vertical micro vias into the metallization.

Ground source coupling is illustrated by the ground micro vias 388, which are depicted coupled to the ground-source traces 367 and 377 from the ground-source flood plains 387 and 387'. As illustrated in this cross-section elevation, ground-source coupling can be vertically (Z-direction) mapped to a M3 metallization with ground-source micro vias 388. Similarly as illustrated, I/O traces within the metallization 301 are depicted at M2 and M4 according to an embodiment.

FIG. 4 is a top plan 400 of an embedded multi-die interconnect die 410 where an enhanced EMIB power-delivery architecture with a single power domain, is stitched into the bridge die 410 according to an embodiment. The bridge die 410 includes an interconnect surface 412 onto which the several micro-via arrays and connection traces are configured. The bridge die 410 uses a single power domain to service a first die 414 and a subsequent die 418 according to an embodiment. The bridge die 410 includes a VCC1 flood plane 416, which is tied onto the on-bridge VCC1 mesh layer through EMIB power-delivery micro vias 424 and 426. Power is stitched to the first and subsequent dice 414 and 418, commencing from the VCC1 flood plain 416 and through the power-delivery micro vias 424 and 426.

Ground contacts 466 are configured within a ground plain 427, and the ground contacts 466 act as ground micro vias 466. Additionally, signal I/O traces 428 (see FIG. 4A) are also configured on the interconnect surface 412, and they are connected through a metallization 401.

FIG. 4A is a cross-section partial cut away elevation and projection of metallization 401 for the bridge die 410 depicted in FIG. 4, taken along the section line 4A-4A according to an embodiment. The metallization 401 is vertically (Z-direction) expanded in the illustration and includes in an embodiment, metal-1 (M1), M2, M3 and M4. Directional arrows 443 indicate current flow to a power rail 428, through respective power-delivery micro-vias 424 and 426 according to an embodiment. From the power rail 428, current flows to power-distribution micro-vias 464 and 474, and to respective power-source traces 463 and 473.

In an embodiment, supplemental power 444 is also introduced peripherally above the Mnth metallization layer. In an embodiment, current flow paths are indicated by directional arrows 444, both by introducing power to the bridge die 410 centrally 443 at the flood plain 416 (see FIG. 4) and peripherally 444 to each power-source trace 463 and 473.

In an embodiment, power delivery is analyzed compared to total peripheral power delivery, where power comes exclusive from a package material for an EMIB die, to the illustrated bridge die 410, where direct-current (DC) voltage is lowered by 11% and by 17% for VCC1 power.

FIG. 5 is a top plan of an embedded multi-die interconnect bridge package 500 according to an embodiment. A first semiconductive device 514 is coupled to a bridge die 510 by microvias such as any of the microvia embodiments depicted in this disclosure. Additionally, a subsequent semiconductive device 518 is also coupled to the first semiconductive device 514 across the bridge die 510. Additionally, a third semiconductive device 519 is also coupled to the first semiconductive device 514 across the bridge die 510. In an embodiment, the EMIB package 500 is built into packing materials 540.

A power flood plain is indicated by power-delivery micro vias 524 and 526, such that power is introduced centrally on the bridge die 510, and is delivered peripherally to power-distribution micro vias 564, 574 and 575 to the respective first, subsequent and third semiconductive devices 514, 518 and 519.

Grounding is carried out by VCC microvias 566, 576 and 577. Similarly to embodiments set forth in all previous figures, grounding is accomplished with a VCC ground rail (not pictured), which is at one of the metallization layers within the metallization. Signal I/O micro vias are illustrated unshaded.

As illustrated in the several embodiments, the several bridge dice 110, 210, 310, 410 and 510 may be characterized as power flood-plain EMIB dice.

Figure 6:
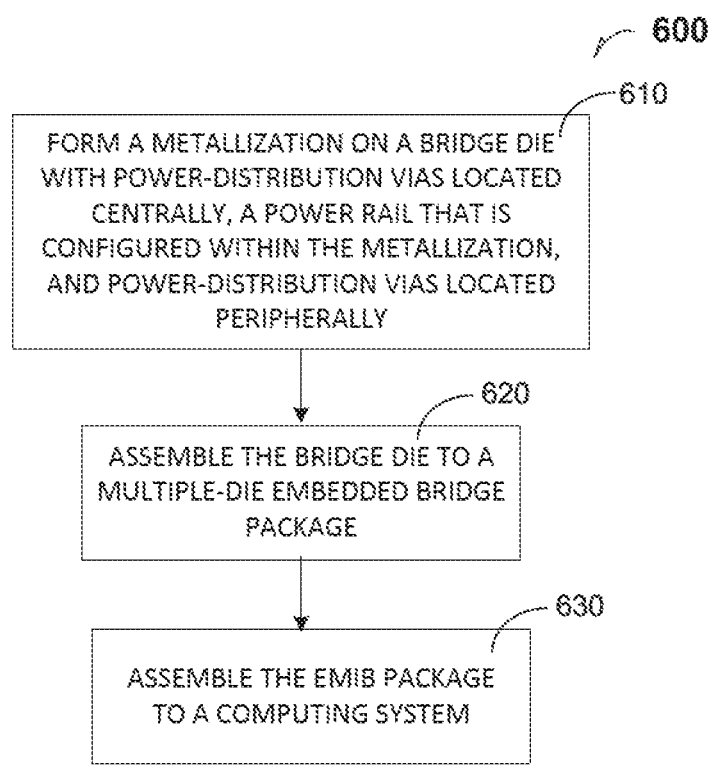
FIG. 6 is a process flow diagram according to an embodiment.

FIG. 6 is a process flow diagram 600 according to an embodiment.

At 610, the process includes forming a metallization on a bridge die with power-delivery micro vias located centrally on the bridge die, a power rail that is configured within the metallization, and power-distribution micro vias located peripherally on the bridge die.

At 620, the process includes assembling the bridge die to a power-flood plain EMIB package.

At 630, the process includes assembling the power flood-plain EMIB package to a computing system.

Figure 7:
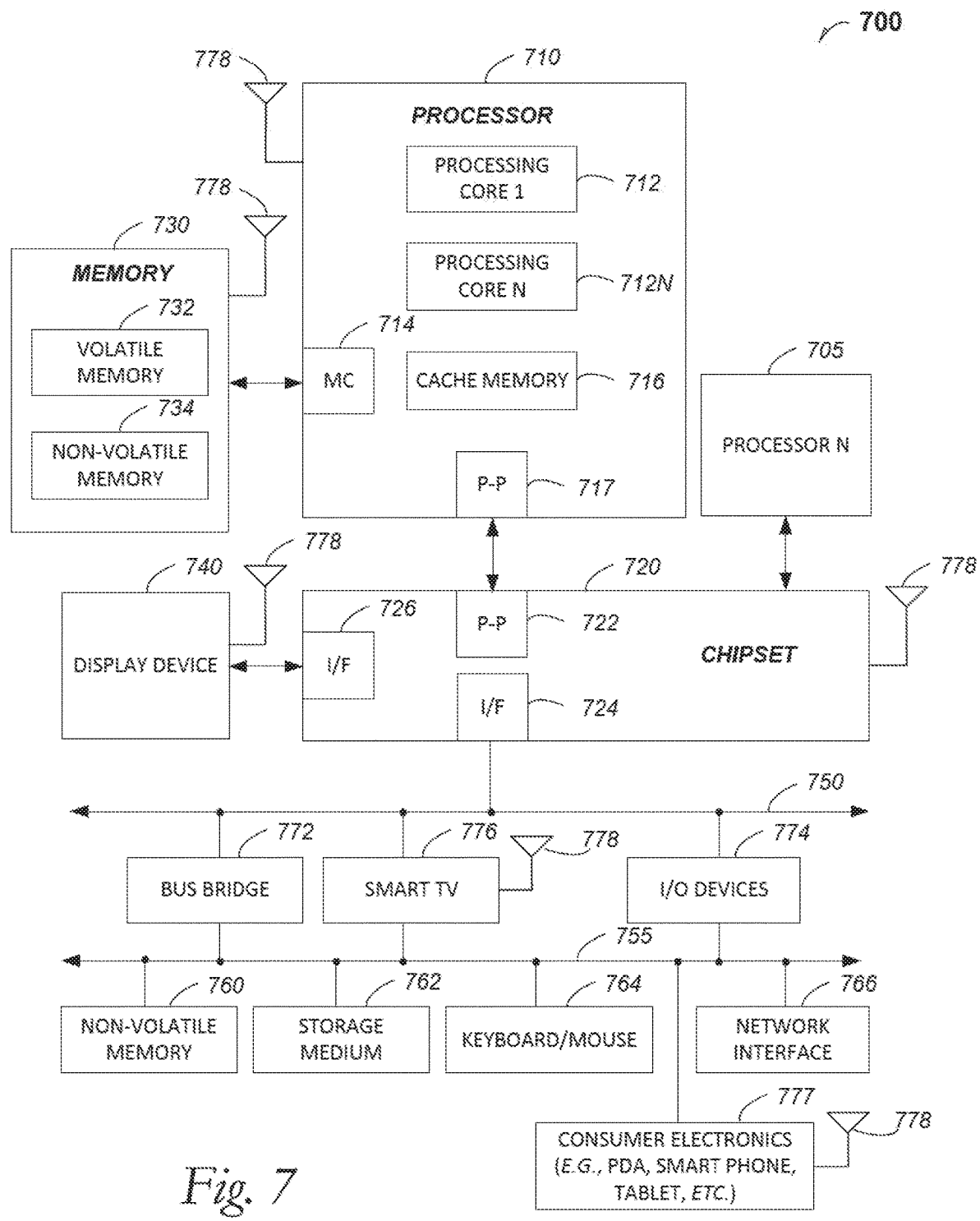
FIG. 7 is included to show an example of a higher-level device application for the disclosed embodiments.

FIG. 7 is included to show an example of a higher-level device application for the disclosed embodiments. The power flood-plain EMIB package embodiments may be found in several parts of a computing system. In an embodiment, the power flood-plain EMIB package embodiments can be part of a communications apparatus such as is affixed to a cellular communications tower. In an embodiment, a computing system 700 includes, but is not limited to, a desktop computer. In an embodiment, a system 700 includes, but is not limited to a laptop computer. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internet appliance. Other types of computing devices may be configured with the microelectronic device that includes power flood-plain EMIB package embodiments.

In an embodiment, the processor 710 has one or more processing cores 712 and 712N, where 712N represents the Nth processor core inside processor 710 where N is a positive integer. In an embodiment, the electronic device system 700 using a power flood-plain EMIB package embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the multi-layer solder resist on a semiconductor device package substrate in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. In an embodiment, the chipset 720 is part of a power flood-plain EMIB package embodiment depicted in FIG. 2. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a power flood-plain EMIB package embodiment as set forth in this disclosure. The chipset 720 enables the processor 710 to connect to other elements in a power flood-plain EMIB package embodiment in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a power flood-plain EMIB package embodiment in a system. Additionally, the chipset 720 connects to one or more buses 750 and 755 that interconnect various elements 774, 760, 762, 764, and 766. Buses 750 and 755 may be interconnected together via a bus bridge 772 such as at least one EMIB package embodiment. In an embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the EMIB package embodiments in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

To illustrate the EMIB package embodiments and methods disclosed herein, a non-limiting list of examples is provided herein:

Example 1 is an embedded multi-die interconnect bridge package, comprising: a power flood plain located centrally on an embedded multi-die interconnect bridge (EMIB) die, wherein the EMIB die is embedded in a semiconductor device package; a first power-delivery micro via on the power flood plain, wherein the first power-delivery micro via is part of a metallization on an interconnect surface of the EMIB die; a subsequent power-delivery micro via on the power flood plain and within the metallization; a power rail within the metallization, wherein the power rail contacts the first and subsequent power-delivery micro vias; a first power-distribution micro via that contacts the power rail, wherein the first power-distribution micro via emerges from the metallization at a die first side; and a subsequent power-distribution micro via that contacts the power rail, wherein the subsequent power-distribution micro via emerges from the metallization at a die subsequent side.

In Example 2, the subject matter of Example 1 optionally includes not occupied by the power rail.

In Example 3, the subject matter of any one or more of Examples 1-2 optionally include a first ground micro via within the metallization of the first die side; a subsequent ground micro via within the subsequent die side; and a ground rail within the metallization that contacts the respective first and subsequent ground micro vias.

Example 4 is a semiconductor device package, comprising: a bridge die disposed in a package substrate, wherein the bridge die includes a metallization at an interconnect surface; a first semiconductive device coupled to the bridge die, wherein the first semiconductive device projects a first footprint over a first portion of the metallization; and a subsequent semiconductive device coupled to the bridge die, wherein the subsequent semiconductive device projects a subsequent footprint over a subsequent portion of the metallization; and wherein the metallization includes a power flood plain that couples a first power-delivery micro via to a power rail, and to a first-die power-distribution micro via that is coupled to the first semiconductive device, wherein power flood plain couples a subsequent power-delivery micro via to the power rail, and to a subsequent-die power-distribution micro via that is coupled to the subsequent semiconductive device, and wherein the power flood plain is disposed between the first power-distribution micro via and the subsequent power-distribution micro via.

In Example 5, the subject matter of Example 4 optionally includes wherein the first power-distribution micro via is one of more than one first power-distribution vias, wherein the subsequent power-distribution micro via is one of more than one subsequent power-distribution micro vias, and wherein the more than one first power-distribution micro vias is more than the more than one subsequent power-distribution micro vias.

In Example 6, the subject matter of any one or more of Examples 4-5 optionally include a first ground micro via disposed within the first footprint; a subsequent ground micro via disposed within the subsequent footprint; and a ground rail within the metallization that contacts the respective first and subsequent ground micro vias.

In Example 7, the subject matter of any one or more of Examples 4-6 optionally include not occupied by the power rail.

In Example 8, the subject matter of any one or more of Examples 4-7 optionally include not occupied by the power rail, further including two of the metallization levels are configured with input/output rails.

In Example 9, the subject matter of any one or more of Examples 4-8 optionally include wherein the first semiconductive device is a logic die and the subsequent semiconductive device is a memory die.

In Example 10, the subject matter of any one or more of Examples 4-9 optionally include power flood plain is disposed between the first footprint and the subsequent footprint.

In Example 11, the subject matter of any one or more of Examples 4-10 optionally include) power flood plain, further including: a second (VCC2) power flood plain, wherein the VCC2 power flood plain is disposed between the first footprint and the subsequent footprint, and wherein the VCC2 power flood plain includes two VCC2 flood plains that are separated by the VCC1 power flood plain; a first plurality of power traces that extend from one of the two VCC2 power flood plains into the first footprint; and a subsequent plurality of power traces that extend from the other of the two VCC2 power flood plains into the subsequent footprint.

In Example 12, the subject matter of any one or more of Examples 4-11 optionally include) power flood plain, further including: a second (VCC2) power flood plain, wherein the VCC2 power flood plain is disposed between the first footprint and the subsequent footprint, and wherein the VCC2 power flood plain includes two VCC2 flood plains that are separated by the VCC1 power flood plain; a first plurality of power traces that extend from one of the two VCC2 power flood plains into the first footprint; a subsequent plurality of power traces that extend from the other of the two VCC2 power flood plains into the subsequent footprint; and a ground flood plain that includes two sections that are separated by the VCC1 power flood plain, wherein one of the two ground flood-plain sections includes a first ground micro via that contacts a ground rail in the metallization, and wherein the other of the two ground flood-plain sections includes a subsequent ground micro via that contacts the ground rail.

In Example 13, the subject matter of any one or more of Examples 4-12 optionally include a third semiconductive device coupled to the first semiconductive device across the bridge die, wherein the subsequent semiconductive device and the third semiconductive device share the interconnect surface opposite the first semiconductive device.

In Example 14, the subject matter of Example 13 optionally includes a first ground micro via disposed within the first footprint; a subsequent ground micro via disposed within the subsequent footprint; a third ground micro via disposed within a third footprint; and a ground rail within the metallization that contacts the respective first, subsequent and third ground micro vias.

Example 15 is a method of operating an embedded multi-die interconnect bridge (EMIB) apparatus, comprising: introducing power to a bridge die on an interconnect surface at a location that is between electrical connections of a first semiconductive device and a subsequent semiconductive device; supplying power to the first semiconductive device by directing current through a first power-delivery via, a power rail that contacts the first power-delivery via, a first power distribution via that contacts the power rail, and to an electrical connection that contacts the first semiconductive device; supplying power to the subsequent semiconductive device by directing current through a subsequent power-delivery via, the power rail, a subsequent power distribution via that contacts the power rail, and to an electrical connection that contacts the subsequent semiconductive device.

In Example 16, the subject matter of Example 15 optionally includes wherein electrical current flows peripherally in a first direction within the bridge die along the power rail between the first power-delivery micro via and the first power-distribution micro via, and wherein electrical current flows peripherally in a subsequent direction within the bridge die along the power rail between the subsequent power-delivery micro via and the subsequent power-distribution micro via.

In Example 17, the subject matter of any one or more of Examples 15-16 optionally include wherein the first power-distribution via is one of a first plurality of power-distribution vias, wherein the subsequent power-distribution via is one of a subsequent plurality of power-distribution vias, and wherein the first plurality is more than the subsequent plurality.

Example 18 is a computing system, comprising: a power flood-plain located centrally on an embedded multi-die interconnect bridge (EMIB) die, wherein the EMIB die is embedded in a semiconductor device package; a first power-delivery via on the power flood-plain, wherein the first power-delivery via is part of a metallization on an interconnect surface of the EMIB die; a subsequent power-delivery via on the power flood-plain and within the metallization; a power rail within the metallization, wherein the power rail contacts the first and subsequent power-delivery vias; a first power-distribution via that contacts the power rail, wherein the first power-distribution via emerges from the metallization at a die first side; and a subsequent power-distribution via that contacts the power rail, wherein the subsequent power-distribution via emerges from the metallization at a die subsequent side; a first semiconductive device coupled to the first power-distribution via, wherein the first semiconductive device occupies a first footprint on the metallization; and a subsequent semiconductive device coupled to the subsequent power-distribution via, wherein the subsequent semiconductive device occupies a subsequent footprint on the metallization; and wherein the EMIB die is part of a chipset.

In Example 19, the subject matter of Example 18 optionally includes wherein the semiconductor device package is attached to a board, and wherein the board includes a shell that provides both physical and dielectric protection to the combination of the first die, the EMIB die and the subsequent die.

In Example 20, the subject matter of any one or more of Examples 18-19 optionally include wherein the semiconductor device package is attached to a board, and wherein the first semiconductive device is a logic die, further including: a display device; and wherein the metallization includes four metallization levels including metal-1 (M1), M2, M3 and M4, and wherein the power rail is disposed at one of M1, M2, M3 and M4, further including a ground rail disposed at one of M1, M2, M3 and M4 not occupied by the power rail.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A bridge die, comprising:
    a first outer portion, a second outer portion, and a central portion from a plan view perspective, the central portion between the first outer portion and the second outer portion;
    a plurality of power-delivery micro-vias in the central portion;
    a first plurality of power-distribution micro-vias in the first outer portion, the first plurality of power-distribution micro-vias electrically coupled to the plurality of power-distribution micro-vias; and
    a second plurality of power-distribution micro-vias in the second outer portion, the second plurality of power-distribution micro-vias electrically coupled to the plurality of power-delivery micro-vias, and the second plurality of power-distribution micro-vias having a total number of power-distribution micro-vias less than a total number of power-distribution micro-vias of the first plurality of power-distribution micro-vias.

2. The bridge die of claim 1, wherein the first and second pluralities of power-distribution micro-vias are electrically are coupled to the plurality of power-delivery micro-vias by one or more power rails.

3. The bridge die of claim 2, wherein the one or more power rails are beneath the first and second pluralities of power-distribution micro-vias and the plurality of power-delivery micro-vias.

4. The bridge die of claim 1, wherein the central portion comprises one or more power bumps.

5. The bridge die of claim 4, wherein the one or more power bumps are electrically connected to the plurality of power-delivery micro-vias by a power header.

6. The bridge die of claim 4, wherein the one or more power bumps are on a periphery of the central portion.

7. The bridge die of claim 1, wherein the first outer portion and the second outer portion further comprise ground micro-vias.

8. An embedded multi-die interconnect bridge package, comprising:
    a packaging material comprising a plurality of build-up layers;
    a bridge die embedded in the packaging material, the bridge die comprising:
        a first outer portion, a second outer portion, and a central portion from a plan view perspective, the central portion between the first outer portion and the second outer portion;
        a plurality of power-delivery micro-vias in the central portion;
        a first plurality of power-distribution micro-vias in the first outer portion, the first plurality of power-distribution micro-vias electrically coupled to the plurality of power-distribution micro-vias; and
        a second plurality of power-distribution micro-vias in the second outer portion, the second plurality of power-distribution micro-vias electrically coupled to the plurality of power-delivery micro-vias, and the second plurality of power-distribution micro-vias having a total number of power-distribution micro-vias less than a total number of power-distribution micro-vias of the first plurality of power-distribution micro-vias; and
    a first semiconductive device on the packaging material, the first semiconductive device electrically coupled to the first outer portion of the bridge die; and
    a second semiconductive device on the packaging material, the second semiconductive device electrically coupled to the second outer portion of the bridge die.

9. The embedded multi-die interconnect bridge package of claim 8, wherein the first semiconductive device is a mother die, and the second semiconductive device is a daughter die.

10. The embedded multi-die interconnect bridge package of claim 8, wherein the first semiconductive device is a logic die, and the second semiconductive device is a memory die.

11. The embedded multi-die interconnect bridge package of claim 8, wherein the packaging material comprises a top dielectric layer.

12. The embedded multi-die interconnect bridge package of claim 8, further comprising:
    a dielectric build-up layer is between the bridge die and the first semiconductive device, and between the bridge die and the second semiconductive device.

13. The embedded multi-die interconnect bridge package of claim 8, wherein the packaging material comprises a power delivery via.

14. The embedded multi-die interconnect bridge package of claim 13, wherein the first semiconductive device is electrically coupled to the power delivery via of the packaging material.

15. The embedded multi-die interconnect bridge package of claim 8, wherein the first and second pluralities of power-distribution micro-vias of the bridge die are electrically are coupled to the plurality of power-delivery micro-vias of the bridge die by one or more power rails in the bridge die.

16. The embedded multi-die interconnect bridge package of claim 15, wherein the one or more power rails of the bridge die are beneath the first and second pluralities of power-distribution micro-vias and the plurality of power-delivery micro-vias of the bridge die.

17. The embedded multi-die interconnect bridge package of claim 8, wherein the central portion of the bridge die comprises one or more power bumps.

18. The embedded multi-die interconnect bridge package of claim 17, wherein the one or more power bumps of the bridge die are electrically connected to the plurality of power-delivery micro-vias of the bridge die by a power header.

19. The embedded multi-die interconnect bridge package of claim 17, wherein the one or more power bumps of the bridge die are on a periphery of the central portion of the bridge die.

20. The embedded multi-die interconnect bridge package of claim 8, wherein the first outer portion and the second outer portion of the bridge die further comprise ground micro-vias.

* * * * *